US008502722B2

(12) United States Patent
Chen

(10) Patent No.: US 8,502,722 B2
(45) Date of Patent: Aug. 6, 2013

(54) ANALOG TO DIGITAL CONVERTING APPARATUS AND METHOD THEREOF

(75) Inventor: Bo-Wei Chen, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/410,303

(22) Filed: Mar. 2, 2012

(65) Prior Publication Data

US 2013/0162456 A1 Jun. 27, 2013

(30) Foreign Application Priority Data

Dec. 23, 2011 (TW) ............................... 100148306 A

(51) Int. Cl.
*H03M 1/12* (2006.01)

(52) U.S. Cl.
USPC ............................ 341/156; 341/155; 341/172

(58) Field of Classification Search
USPC .......................................... 341/155, 156, 172
See application file for complete search history.

(56) References Cited

U.S. PATENT DOCUMENTS

| 5,099,240 | A | * | 3/1992 | Nakatani et al. ............... 341/156 |
| 5,247,301 | A | | 9/1993 | Yahagi et al. |
| 5,581,255 | A | * | 12/1996 | Hsu ............................... 341/156 |
| 5,745,067 | A | | 4/1998 | Chou et al. |
| 6,014,097 | A | | 1/2000 | Brandt |
| 6,121,912 | A | * | 9/2000 | Brandt ........................... 341/156 |
| 6,583,747 | B1 | * | 6/2003 | van der Goes et al. ....... 341/156 |
| 7,190,298 | B2 | * | 3/2007 | Mulder .......................... 341/156 |
| 7,215,274 | B2 | | 5/2007 | Liu |
| 7,429,945 | B2 | * | 9/2008 | Shiu et al. ..................... 341/156 |
| 7,710,305 | B2 | * | 5/2010 | Taft ............................... 341/156 |
| 7,791,523 | B2 | | 9/2010 | Zhuang |
| 7,978,105 | B2 | | 7/2011 | Oo et al. |
| 2005/0162299 | A1 | * | 7/2005 | Mulder .......................... 341/156 |
| 2010/0182183 | A1 | | 7/2010 | Oo |

FOREIGN PATENT DOCUMENTS

| JP | 57-005427 | 1/1982 |
| JP | 05-122076 | 5/1993 |
| JP | 05-347561 | 12/1993 |
| TW | I260089 | 8/2006 |

OTHER PUBLICATIONS

Pedro M. Figueiredo et al., "A 90nm CMOS 1.2V 6b 1GS/s Two-Step Subranging ADC", IEEE International Solid-State Circuits Conference, Session 31, 2006, p. 1-p. 10.

(Continued)

*Primary Examiner* — Jean B Jeanglaude
(74) *Attorney, Agent, or Firm* — Jianq Chyun IP Office

(57) ABSTRACT

An analog-to-digital converting (ADC) apparatus is disclosed. The ADC apparatus includes a coarse comparing module, at least one pre-switching detection module, at least one fine comparing module, and an encoder. The coarse comparing module compares an input signal and a plurality of first reference signals to generate a previous comparing result and a coarse comparing result in sequence. The pre-switching detection module generates a plurality of previous selecting signals according to the received previous comparing result. The encoder generates a previous encoding result according to the coarse comparing result. The fine comparing module selects a selected reference signal to be compared with the input signal from a plurality of second reference signals according to the previous selecting signals and the previous encoding result, so as to generate a fine comparing result.

20 Claims, 10 Drawing Sheets

OTHER PUBLICATIONS

Bob Verbruggen et al., "A 2.2mW 5b 1.75GS/S Folding Flash ADC in 90nm Digital CMOS", IEEE International Solid-State Circuits conference, Session 12, 2008, p. 252-p. 253, p. 611.

Geert Van Der Plas et al., "A 150MS/S 133uW 7b ADC in 90nm digital CMOS Using a Comparator-Based Asynchronous Binary-Search sub-ADC", IEEE International Solid-State Circuits conference, Session 12, 2008, p. 242-p. 243, p. 610.

Ying-Zu Lin et al, "A 5b 800MS/S 2mW Asynchronous Binary-Search ADC in 65nm CMOS", IEEE International Solid-State Circuits Conference, Session 4, 2009, p. 80-p. 82.

Kenichi Ohhata et al., "Design of a 770-MHz, 70-mW, 8-bit Subranging ADC Using Reference Voltage Precharging Architecture", IEEE Journal of Solid-State Circuits, vol. 44, No. 11, Nov. 2009, p. 2881-p. 2890.

Zhiheng Cao et al., "A 32mW 1.25GS/s 6 b 2b/step SAR ADC in 0.13um CMOS", IEEE International Solid-State Circuits conference, Session 30, 2008, p. 542-p. 543, p. 634.

"Office Action of Japan Counterpart Application", issued on Feb. 12, 2013, p. 1-p. 3.

* cited by examiner

ANALOG TO DIGITAL CONVERTING APPARATUS AND METHOD THEREOF

CROSS-REFERENCE TO RELATED APPLICATION

This application claims the priority benefit of Taiwan application serial no. 100148306, filed Dec. 23, 2011. The entirety of the above-mentioned patent application is hereby incorporated by reference herein and made a part of this specification.

BACKGROUND

1. Technical Field

The disclosure relates to an analog-to-digital converting (ADC) apparatus.

2. Description of Related Art

Referring to a block diagram of a conventional sub-ranging ADC apparatus 100 shown in FIG. 1, the ADC apparatus 100 includes a plurality of levels of comparing modules 101, 102 and 103, an encoder 120, and a reference signal generator 130. The comparing modules 101, 102 and 103 all receive an input signal VIN in an analog format. The comparing module 101 performs a coarse comparing action on the input signal VIN and reference signals VREF1 to generate a digital comparing result D1.

After the comparing module 101 finishes the coarse comparing action, the comparing module 102 receives a first level of previous encoding result DEN1 generated by the encoder 120. According to the first level of previous encoding result DEN1, the comparing module 102 first selects a group of selected reference signals from reference signals VREF2, and then performs the comparing action on the input signal and the selected reference signals to generate a digital comparing result D2 accordingly. Likewise, after the comparing module 102 finishes the fine comparing action, a next level of comparing module may perform a finer comparing action according to a second level of previous encoding result DEN2 generated by the encoder 120. After a last level of comparing module 103 finishes the comparing action on the input signal and a group of selected reference signals selected from reference signals VREFi according to a penultimate level of previous encoding result DEN(i−1) generated by the encoder 120, the encoder 120 may perform encoding according to a plurality of digital comparing results D1-Di generated by the comparing modules 101-130 (here, i represents a positive integer), and generate an encoding result DOUT, which represents an ADC result of the input signal VIN.

SUMMARY

Accordingly, the disclosure is directed to an ADC apparatus and a method thereof for reducing the data conversion time of ADC.

The disclosure provides an ADC method for reducing the data conversion time of ADC. The disclosure provides an ADC apparatus, which includes a coarse comparing module, at least one pre-switching detection module, at least one fine comparing module, and an encoder. The coarse comparing module receives an input signal and compares the input signal and a plurality of first reference signals to generate a previous comparing result and a coarse comparing result in sequence. The pre-switching detection module receives the previous comparing result to generate a previous selecting signal according to the previous comparing result. The encoder generates a previous encoding result according to the coarse comparing result. The fine comparing module is coupled to the pre-switching detection module, receives the input signal, the previous selecting signal and a first previous encoding result, selects a plurality of primary reference signals from a plurality of second reference signals according to the previous selecting signal and the previous encoding result, and compares the input signal and a selected reference signal from the primary reference signals to generate a fine comparing result.

The disclosure provides an ADC method, including: receiving an input signal and comparing the input signal and a plurality of reference signals to generate a previous comparing result and a coarse comparing result in sequence; generating a previous selecting signal according to the previous comparing result; furthermore, selecting a plurality of primary reference signals from a plurality of second reference signals according to the previous selecting signal and the previous encoding result; and generating a fine comparing result by comparing a selected signal in the primary reference signals with the input signal.

Based on the above, in the disclosure, when the coarse comparing unit performs the comparing action of relatively wide range, the previous selecting signal is generated by using the rapidly generated previous comparing result, and the first level of previous encoding result is generated by using the coarse comparing result generated by the coarse comparing unit. In this way, the fine comparing module may select the selected reference signal to be compared with the input signal from the primary reference signals according to the previous encoding result and the previous selecting signals, and then generate the fine comparing result. In this way, the selection of the primary reference signals corresponding to a next level of fine comparing module may be performed at the same time when the current level of comparing module performs the comparing action on the input signal. Therefore, the conversion time of the ADC is effectively saved, thereby achieving a purpose of speeding up data converting.

In order to make the aforementioned features and advantages of the disclosure comprehensible, embodiments are described in detail below with reference to the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
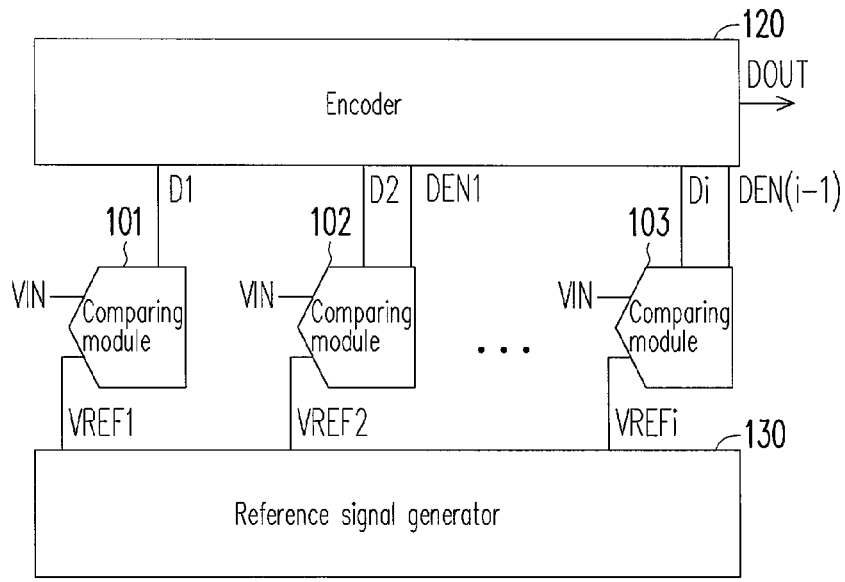
FIG. 1 shows a block diagram of a conventional sub-ranging ADC apparatus 100.

Reference will now be made in detail to the present embodiments of the invention, examples of which are illustrated in the accompanying drawings. Wherever possible, the same reference numbers are used in the drawings and the description to refer to the same or like parts.

Figure 2:
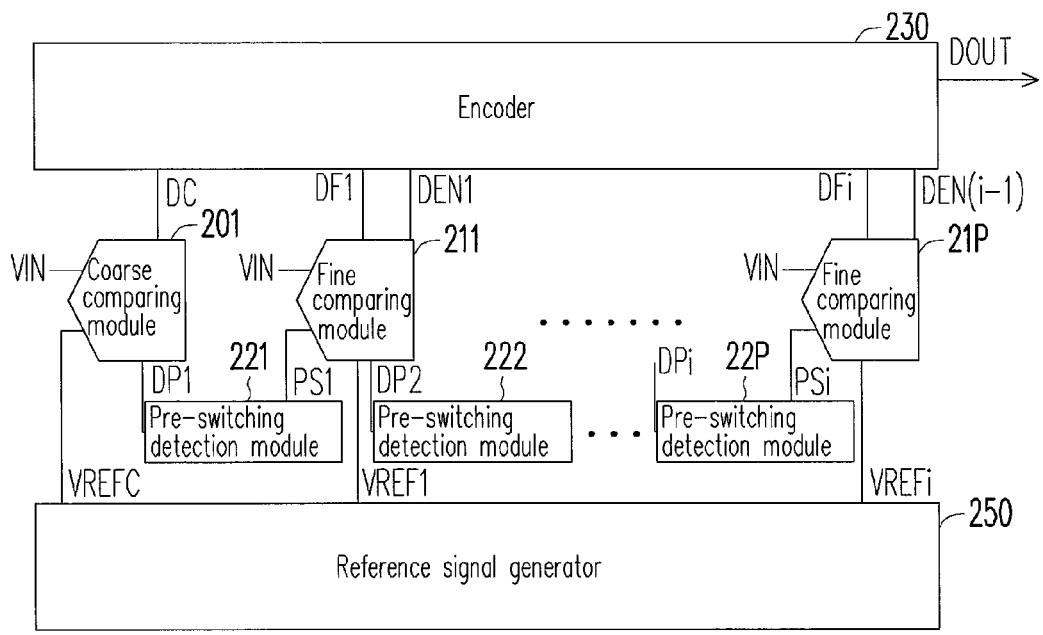
FIG. 2 shows a schematic view of an ADC apparatus 200 according to an embodiment of the disclosure.

Referring to FIG. 2, FIG. 2 shows a schematic view of an ADC apparatus 200 according to an embodiment of the disclosure. The ADC apparatus 200 includes a coarse comparing module 201, fine comparing modules 211-21P, pre-switching detection modules 221-22P, an encoder 230, and a reference signal generator 250. The reference signal generator 250 is coupled to the coarse comparing module 201 and the fine comparing modules 211-21P, and the reference signal generator 250 is used to provide reference signals VREFC and VREF1-VREFi, in which i is a positive integer. The coarse comparing module 201 receives an analog input signal VIN and compares the input signal VIN and a plurality of reference signals VREFC to generate a previous comparing result DP1 and a coarse comparing result DC in sequence. In the pre-switching detection modules 221-22P, a first level of pre-switching detection module 221 is coupled to the coarse comparing module 201 and the fine comparing module 211. It should be noted that, the previous comparing result DP1 is generated before the coarse comparing result DC. That is to say, before the ultimate coarse comparing result DC of the coarse comparing module 201 is generated, the previous comparing result DP1 is generated first.

The pre-switching detection module 221 receives the previous comparing result DP1 and generates a previous selecting signal PS1 according to the previous comparing result DP1. In addition, the encoder 230 generates a previous encoding result DEN1 according to the coarse comparing result DC. The previous selecting signal PS1 and the previous encoding result DEN1 are provided in sequence and coupled to the fine comparing module 211. After receiving the previous selecting signal PS1, the fine comparing module 211 may select a plurality of primary reference signals or pre-amplifiers to be compared with the input signal VIN from a plurality of reference signals VREFF1 or pre-amplifiers (not shown). Moreover, after the previous encoding result DEN1 is stably generated, the fine comparing module 211 may select a group of selected reference signals from the plurality of primary reference signals. The selected reference signals are then compared with the input signal VIN, so as to generate a fine comparing result DF1. Alternatively, the fine comparing module 211 may also select a group of enabled pre-amplifiers from a plurality of enabled pre-amplifiers set within the fine comparing module 211. The selected enabled pre-amplifiers are then compared with the input signal VIN, so as to generate the fine comparing result DF1.

Here, when the fine comparing module 211 performs a comparing action on the input signal VIN and the selected reference signals or the enabled pre-amplifiers, a previous comparing result DP2 is generated first and then the fine comparing result DF1 is generated, which is similar to that of the coarse comparing module 201. The previous comparing result DP2 may be provided to a next level of pre-switching detection module 222. The pre-switching detection module 222 may accordingly generate a previous selecting signal to be provided to a next level of fine comparing module. The pre-switching detection module 22P generates a previous selecting signal PSi according to a received previous comparing result DPi. The fine comparing module 21P receives the previous selecting signal PSi generated by the pre-switching detection module 22P to perform a fine comparing action.

It should be noted that, the quantity of the fine comparing module(s) is not fixed, but can be set by a designer according to requirements of a system that the ADC apparatus 200 belongs to. The quantity of the fine comparing module(s) is at least an integer larger than or equal to 1.

The encoder 230 is coupled to the coarse comparing module 201 and the fine comparing modules 211 to 21P, receives the coarse comparing result DC and the fine comparing results DF1-DFi for encoding, in which i is a positive integer, thereby obtaining an encoding result DOUT. The encoding result is an ADC result corresponding to the input signal VIN.

Figure 3A:
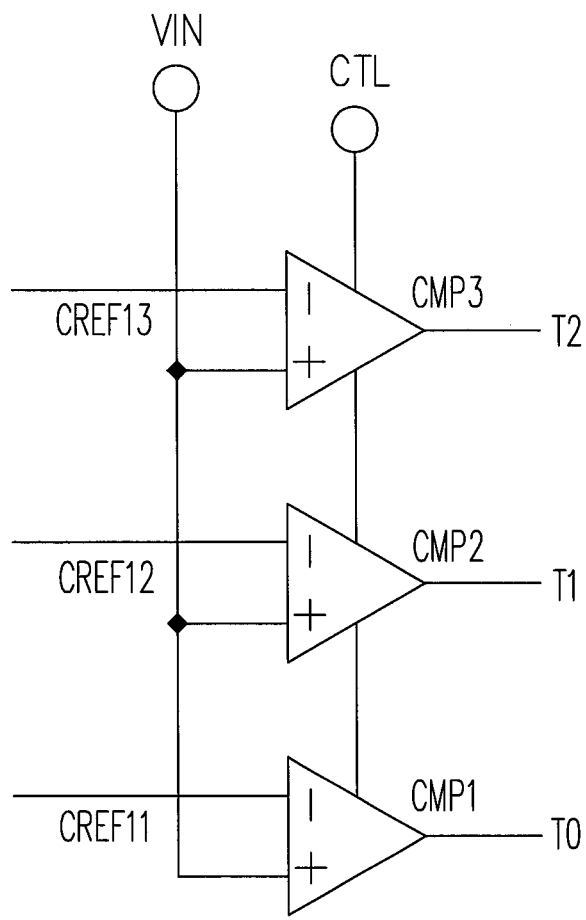
FIG. 3A shows a schematic view of an implementing mode of a coarse comparing module 201.

As regards the implementing mode of the coarse comparing module 201, referring to FIG. 3A, FIG. 3A shows a schematic view of an implementing mode of the coarse comparing module 201. The coarse comparing module 201 includes a control signal CTL, a plurality of comparators CMP1-CMP3, and a plurality of reference signals CREF11-CREF13. The reference signals CREF11-CREF13 are respectively coupled to the comparators CMP1-CMP3. The relationship of voltage magnitudes of the reference signals is that: reference signal CREF11<reference signal CREF12<reference signal CREF13.

Figure 3B:
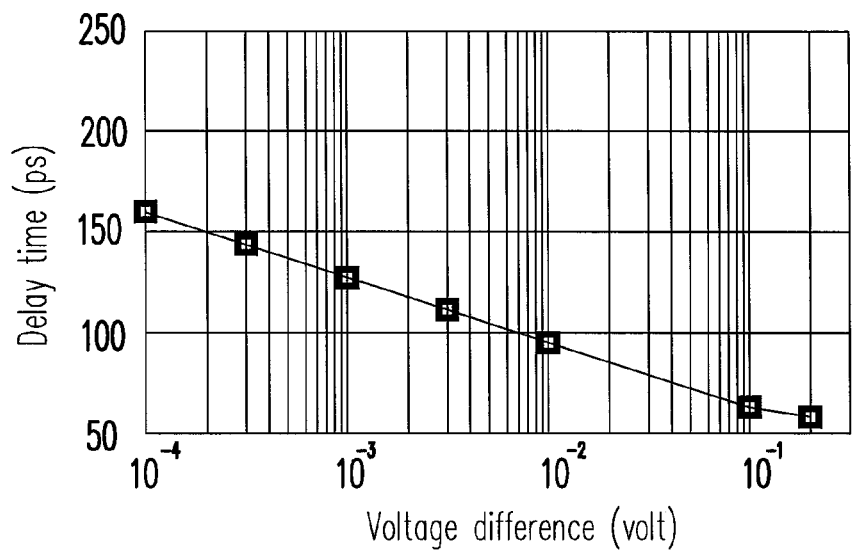
FIG. 3B shows a relationship diagram between a delay time from enabling of a comparator through a control signal CTL to determining that an output result is stable and an input voltage difference of a compared signal of the corresponding comparator.

The comparators CMP1-CMP3 commonly receive the input signal VIN and determine the time to perform the comparing action on the input signal VIN and the reference signals CREF11-CREF13 according to the control signal CTL, so as to generate comparing results T0-T2. Referring to FIG. 3B in the following, FIG. 3B shows a relationship diagram between a delay time from enabling of a comparator through a control signal CTL for determining that an output result is stable and an input voltage difference of a compared signal of the corresponding comparator. It can be clearly observed in FIG. 3B that, when the input voltage difference of the compared signal received by the comparator is smaller, the time delay required by the comparator to perform the comparing action is greater (comparing result is generated more slowly). On the contrary, when the input voltage difference of the compared signal received by the comparator is greater, the time delay required by the comparator to perform the comparing action is smaller (the comparing result is generated faster).

Referring to FIG. 3A in combination with the relationship diagram of FIG. 3B, when the input signal VIN is close to the reference signal CREF13, a comparing result T2 of the comparator CMP3 is generated at a slowest speed while a comparing result T0 of the comparator CMP1 is generated at a fastest speed. That is to say, in this condition, when the comparing result T0 is determined, a logic state of the comparing results T0-T2 at this time is the previous comparing result. After the comparing result T2 is determined, the logic state of the comparing results T0-T2 at this time is the coarse comparing result. More specifically, when the previous comparing result (for example, the comparing result T0) of the comparing results generated by the comparator is determined, only the logic state of the comparing result T0 may be determined. However, the logic state of the comparing results T1 and T2 is unknown at this time. Likewise, after the logic state of the comparing result T2 is determined, the logic state of the comparing result T1 is definitely known.

Correspondingly, when the input signal YIN is close to the reference signal CREF11, the comparing result T2 of the comparator CMP3 is generated at a fastest speed while the comparing result T0 of the comparator CMP1 is generated at a slowest speed. That is to say, in this condition, when the comparing result T2 is determined, the logic state of the comparing results T0-T2 at this time is used as the previous comparing result. After the comparing result T0 is determined, the logic state of the comparing results T0-T2 at this time is used as the coarse comparing result. More specifically, when the previous comparing result is determined, only the logic state of the comparing result T2 may be determined. However, the logic state of the comparing results T1 and T0 is unknown at this time. Likewise, after the logic state of the comparing result T0 is determined, the logic state of the comparing result T1 is definitely known.

As regards the implementing mode of the coarse comparing module 201, referring to FIG. 3A, FIG. 3A shows a schematic view of an implementing mode of the coarse comparing module 201. The coarse comparing module 201 includes a control signal CTL, a plurality of comparators CMP1-CMP3, and a plurality of reference signals CREF11-CREF13. The reference signals CREF11-CREF13 are respectively coupled to the comparators CMP1-CMP3. The relationship of voltage magnitudes of the reference signals is that: reference signal CREF11<reference signal CREF12<reference signal CREF13.

The comparators CMP1-CMP3 commonly receive the input signal VIN and determine, according to the control signal CTL, time to perform the comparing action on the input signal VIN and the reference signals CREF11-CREF13, so as to generate comparing results T0-T2.

Figure 4A:
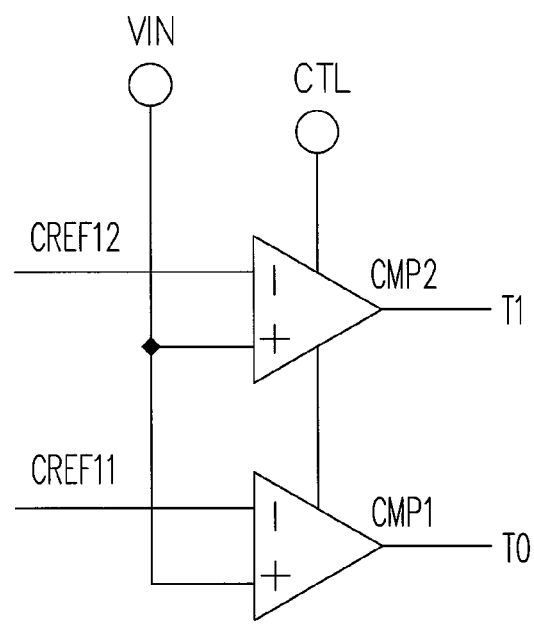
FIG. 4A and FIG. 4B show different implementing modes of a coarse comparing module 201.
Figure 4B:
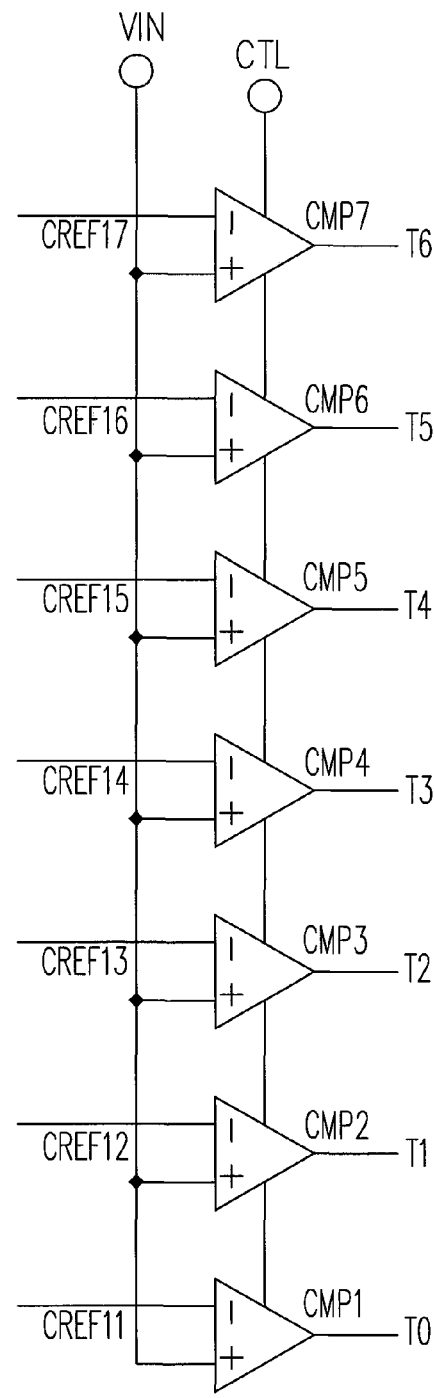

Definitely, the aforementioned coarse comparing module 201 is not limited to be constructed by using three comparators CMP1-CMP3. Referring to FIG. 4A and FIG. 4B in the following, FIG. 4A and FIG. 4B show different implementing modes of the coarse comparing module 201. In FIG. 4A, the reference signals CREF11 and CREF12 are respectively coupled to the comparators CMP1 and CMP2. The relationship of voltage magnitudes of the reference signals is that: reference signal CREF11<reference signal CREF12. The comparators CMP1 and CMP2 commonly receive the input signal VIN and determine, according to the control signal CTL, time to perform the comparing action on the input signal VIN and the reference signals CREF11 and CREF12, so as to generate comparing results T0 and T1.

In FIG. 4B, reference signals CREF11-CREF17 are respectively coupled to comparators CMP1-CMP7. The reference signals CREF11-CREF17 may be arranged in sequence base on arithmetic series. The reference signal CREF11 has a minimum reference voltage and the reference signal CREF 17 has a maximum reference voltage. The comparators CMP1-CMP7 commonly receive the input signal VIN and determine, according to the control signal CTL, time to perform the comparing action on the input signal VIN and the reference signals CREF11-CREF17, so as to generate comparing results T0-T6.

It should be noted that, in the implementing mode of FIG. 4B, taking the input signal VIN falling within the range of the reference signals CREF11-CREF13 as an example, the comparing results T4-T6 are generated faster than the comparing results T0-T2. In other words, the comparing results T0-T2 are generated slower than the comparing results T4-T6. That is to say, when the comparing results T4-T6 are determined, the logic state of the comparing results T0-T6 at this time is the previous comparing result. After the comparing results T0-T2 are determined, the logic state of the comparing results T0-T6 at this time is the coarse comparing result. More specifically, when the previous comparing result is determined, the logic state of the comparing results T4-T6 may be determined. However, the logic state of the comparing results T0-T3 is unknown at this time. Likewise, after the logic state of the comparing result T0-T2 is determined, the logic state of the comparing result T3 is definitely known.

Figure 5:
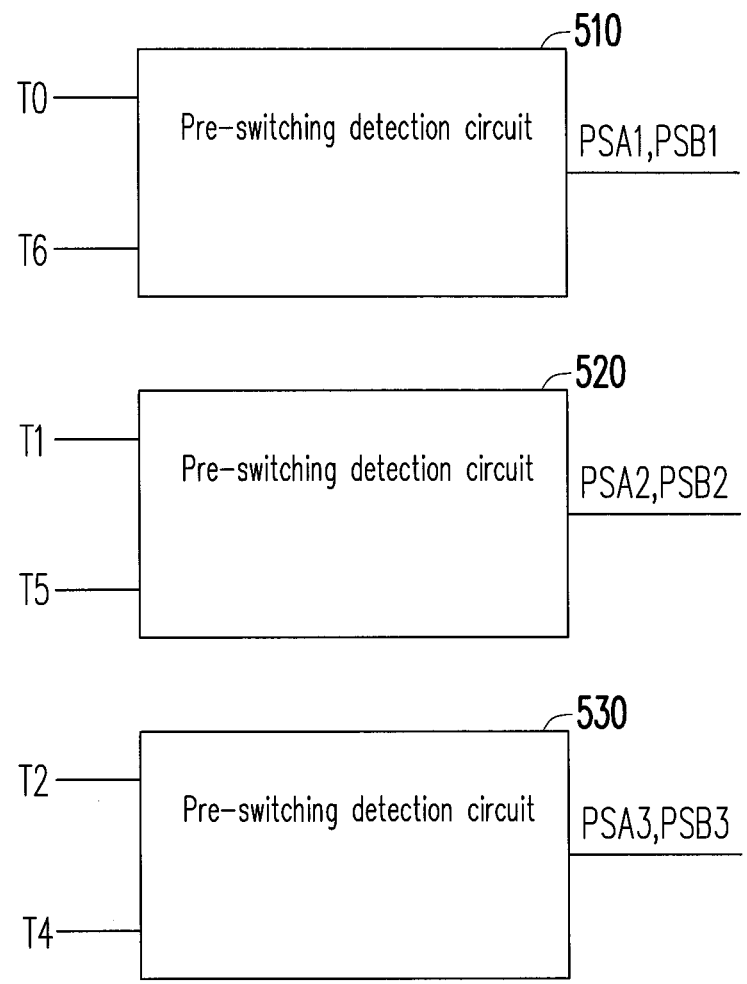
FIG. 5 shows an implementing mode of a pre-switching detection module according to an embodiment of the disclosure.

Referring to FIG. 5, FIG. 5 shows an implementing mode of a pre-switching detection module according to an embodiment of the disclosure. The pre-switching detection module 221 is taken as an example. The pre-switching detection module 221 includes pre-switching detection circuits 510-530. Referring to the coarse comparing module 201 shown in FIG. 4B, the pre-switching detection module 221 is coupled to the comparing results T0-T2 and T4-T6 generated by the coarse comparing module 201. The pre-switching detection circuit 510 receives the comparing results T0 and T6. The pre-switching detection circuit 520 receives the comparing results T1 and T5. Meanwhile, the pre-switching detection circuit 530 receives the comparing results T2 and T4. Taking the input signal VIN falling within the range of reference signals CREF11-CREF13 as an example, when the logic state of the comparing results T4-T6 is determined, the comparing results T0-T2 and the comparing results T4-T6 in the comparing results T0-T6, which is used as the previous comparing result at this time, may affect the pre-switching detection circuits 510~530 to respectively generate previous selecting signals PSA1-PSA3 and PSB1-PSB3. In other words, the previous selecting signal PS1 generated by the pre-switching detection module 221 in this embodiment is a group of six-bits signals including the previous selecting signals PSA1-PSA3 and PSB1-PSB3.

It should be noted that, the quantity of the pre-switching detection circuit(s) set in the pre-switching detection module is decided according to the quantity of the comparator(s) of a previous level of coarse comparing module (or fine comparing module). If the quantity of the comparator(s) of the previous level of coarse comparing module (or fine comparing module) is equal to N (N is a positive integer), the quantity of pre-switching detection circuit(s) set in the pre-switching detection module is equal to N/2 (a remainder thereof is cast unconditionally, and a quotient thereof is taken).

Figure 6A:
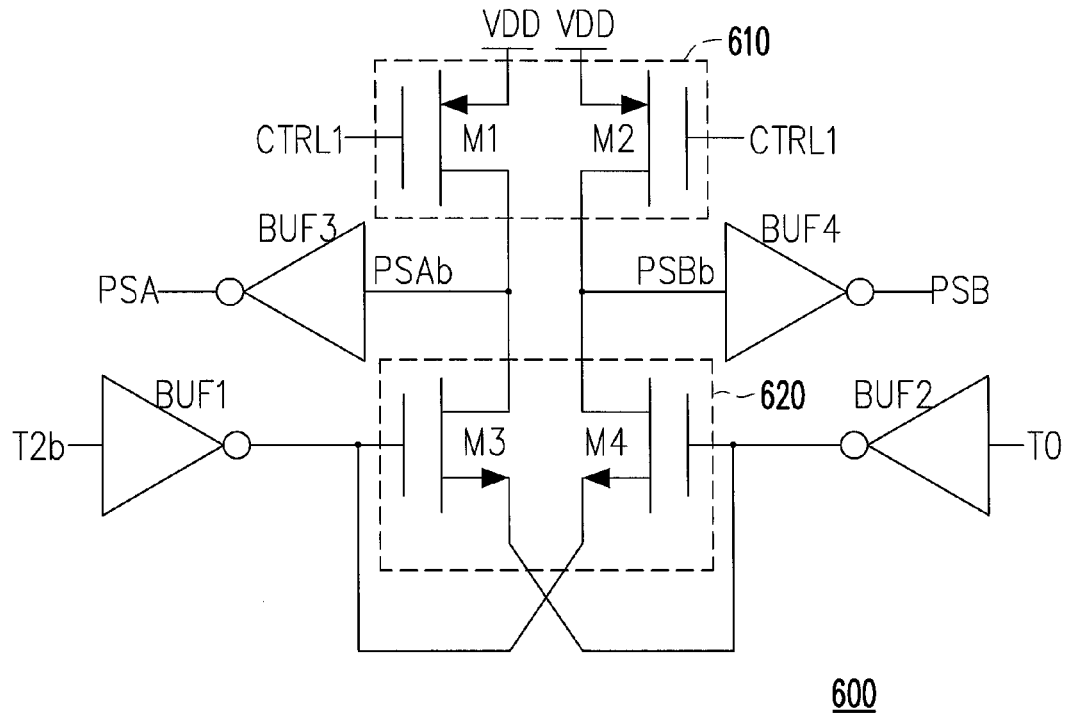
FIG. 6A shows an implementing mode of a pre-switching detection circuit 600 according to an embodiment of the disclosure.

Referring to FIG. 6A, FIG. 6A shows an implementing mode of a pre-switching detection circuit 600 according to an embodiment of the disclosure. The pre-switching detection circuit 600 includes a pre-charging switch circuit 610, buffers BUF1-BUF4, and a voltage transmitting switch circuit 620. The pre-charging switch circuit 610 receives a reference power supply VDD and is controlled by a control signal CTRL1. The pre-charging switch circuit 610 is conducted when the control signal CTRL1 is a logic low-level voltage, and charges an electric potential of endpoints PSAb and PSBb to the reference power supply VDD, so as to finish the pre-charging action.

When the control signal CTRL1 is a logic high-level voltage, the pre-charging switch circuit 610 is switched off. The buffers BUF1 and BUF2 respectively receive a reverse signal T2b of a comparing result T2 as well as a comparing result T0 generated by a previous comparing module (a coarse comparing module or a fine comparing module) (referring to the schematic view of the comparing module shown in FIG. 6B). The buffers BUF1 and BUF2 provide the generated outputs to the voltage transmitting switch circuit 620. In this embodiment, both the buffers BUF1 and BUF2 are inverters.

The voltage transmitting switch circuit 620 determines whether to transmit the output of the buffer BUF2 to the endpoint PSAb according to the output of the buffer BUF1. The voltage transmitting switch circuit 620 determines whether to transmit the output of the buffer BUF1 to the endpoint PSBb according to the output of the buffer BUF2.

In this embodiment, the pre-charging switch circuit 610 is formed by transistors M1 and M2. First terminals (for example, sources) of the transistors M1 and M2 are coupled to the reference power supply VDD. Control terminals (for example, gates) of the transistors M1 and M2 are coupled to the control signal CTRL1. Meanwhile, second terminals (for example, drains) of the transistors M1 and M2 are respectively coupled to the endpoints PSAb and PSBb. It is taken as an example that the transistors M1 and M2 are P-type transistors. The transistors M1 and M2 are P-type transistors, are conducted when the control signal CTRL1 is a logic low-level voltage, and perform the pre-charging action of charging the endpoints PSAb and PSBb to the reference power supply VDD.

The buffers BUF1 and BUF2 are formed by inverters, and are used for driving a parasitic capacitance load. The buffer BUF1 transmits an output signal opposite the reverse signal T2$b$ to the voltage transmitting switch circuit 620. Meanwhile, the buffer BUF2 transmits an output signal opposite the comparing signal T0 to the voltage transmitting switch circuit 620. The voltage transmitting switch circuit 620 is formed by transistors M3 and M4. It is taken as an example that the transistors M3 and M4 are N-type transistors. Second terminals (for example, drains) of the transistors M3 and M4 are respectively coupled to the endpoints PSAb and PSBb. Control terminals (for example, gates) of the transistors M3 and M4 are respectively coupled to output terminals of the buffers BUF1 and BUF2. First terminals (for example, sources) of the transistors M3 and M4 are respectively coupled to the output terminals of the buffers BUF2 and BUF1.

The pre-switching detection circuit 600 further includes buffers BUF3 and BUF4, which are used for by driving a parasitic capacitance load. Input terminals of the buffers BUF3 and BUF4 are respectively coupled to the endpoints PSAb and PSBb. The buffers BUF3 and BUF4 respectively generate previous selecting signals PSA and PSB at output terminals thereof.

Figure 6B:
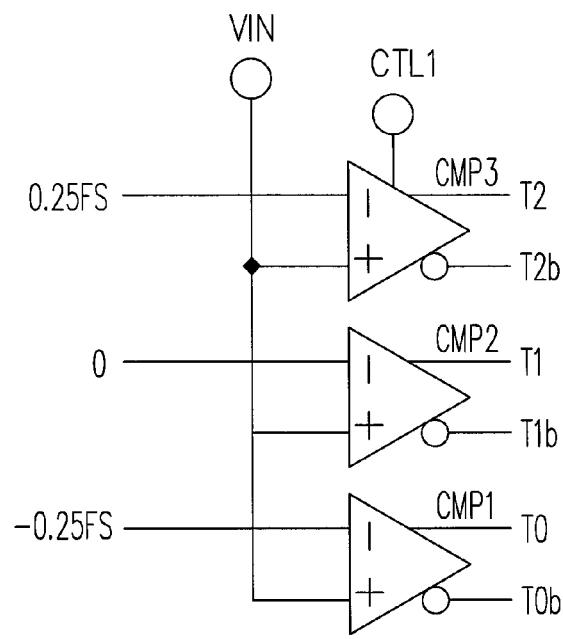
FIG. 6B to FIG. 6D show schematic views of actions of the pre-switching detection circuit 600.
Figure 6C:
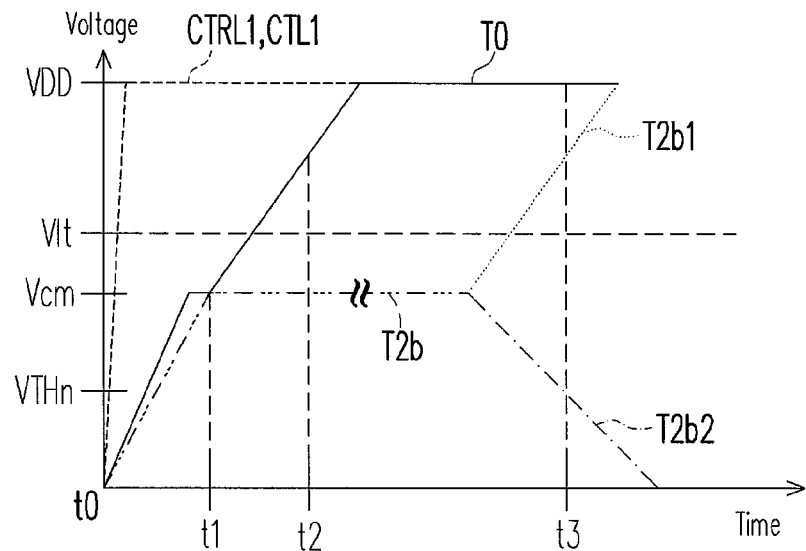
Figure 6D:
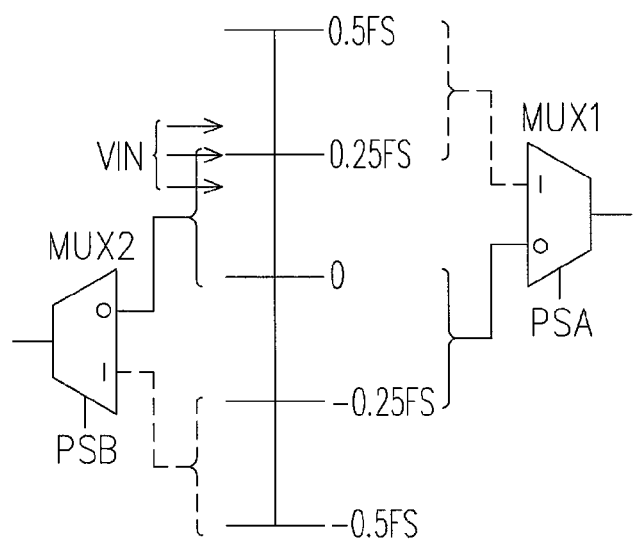

As regards action details of the pre-switching detection circuit 600, please refer to FIGS. 6A, 6B, 6C, and 6D at the same time. FIGS. 6C and 6D show operating schematic views of circuits corresponding to the pre-switching detection circuit 600. First of all, at a time point t0, the control signals CTRL1 and CTL1 are both logic low-level voltages. Referring to FIG. 6B, comparing results T0-T2 and T0$b$-T02$b$ of a previous level of comparing module (a coarse comparing module or a fine comparing module) are both reset to the logic low-level voltage. The pre-charging switch circuit 610 provides the reference power supply VDD to the endpoints PSAb and PSBb, and makes the previous selecting signals PSA and PSB equal to the logic low-level voltage (for example, equal to a grounding voltage). It can be known from FIG. 6D that, the primary reference signals are set within reference signals 0.25 FS to −0.25 FS, in which FS represents a full-oscillating amplitude range of the ADC apparatus. After the control signals CTRL1 and CTL1 are both increased to the logic high-level voltage, the aforementioned pre-charging action and the reset mechanism of the comparators in the previous level of comparing module end.

Subsequently, referring to FIGS. 6A, 6B, 6C, and 6D at the same time, it is taken as an example that the input signal VIN is approximately equal to the reference signal 0.25 FS. The input signal VIN is compared with three reference signals, −0.25 FS, 0, and 0.25 FS by the comparators CMP1-CMP3 at this time. It can be known from FIG. 6C that, at a time point t1, the comparing result T0 and T2$b$ are increased to a voltage level that is equal to an intermediate voltage Vcm generated by a corresponding comparator. In this state, the comparing results of the comparators fail to exceed a logic threshold voltage Vlt of the buffers BUF1 and BUF2 of the pre-switching detection circuit 600. Therefore, the outputs of the buffers BUF1 and BUF2 still maintain the logic high-level voltage, and as a result, the transistors M3 and M4 are not effectively conducted. At this time, the primary reference signals are set within the reference signals 0.25 FS to −0.25 FS. Subsequently, the comparing result T0 is generated faster than the comparing result T2$b$. Therefore, at a time point t2 (the logic state of the comparing results T0-T2 and TOb-T2$b$ at this time represent the previous comparing result), the comparing result T0 exceeds the logic threshold voltage Vlt of the buffer BUF2, so that the buffer BUF2 generates an output lower than the threshold voltage VTHn of the transistor M4, and the transistor M4 enters a cut-off region.

In addition, the buffer BUF1 continuously receives the comparing result T2$b$ that is equal to the intermediate voltage Vcm. Therefore, the output of the buffer BUF1 still maintains the logic high-level voltage. Thus, the transistor M3 is effectively conducted at the time point t2. In this way, the output generated by the buffer BUF2 lower than the threshold voltage VTHn of the transistor M4 is transmitted to the endpoint PSAb through the transistor M3. That is to say, at the time point t2, the voltage of the endpoint PSAb is a voltage value lower than the threshold voltage VTHn of the transistor M4. Meanwhile, the voltage value of the previous selecting signal PSA generated by the buffer BUF3 changes from the logic low-level voltage to the logic high-level voltage. The primary reference signals change to be set within the reference signals 0.5 FS to 0 through a multiplexer MUX1 (referring to FIG. 6D). In this way, primary reference signals are effectively set according to the previous selecting signal.

At a time period t3, the comparing result T2$b$ of the comparator CMP3 in FIG. 6B starts to change with the varied difference between the input signal VIN and reference signal 0.25 FS. It is assumed that the input signal VIN is slightly smaller than the reference signal 0.25 FS. Then, the reverse signal T2$b$ of the comparing result T2 is increased to the logic high-level voltage. The voltage value that changes along time is shown by a line segment T2$b$1 in FIG. 6D. This result may make the output of the buffer BUF1 be decreased to the logic low-level voltage. Alternatively, the input signal VIN is slightly greater than the reference signal 0.25 FS, and then the reverse signal T2$b$ of the comparing result T2 is lowered to the logic low-level voltage. The voltage value that changes along time is shown by a line segment T2$b$2 in FIG. 6D. The output of the buffer BUF1 still maintains the logic high-level voltage. Therefore, the circuit operating relationship among the pre-switching detection circuit, the previous level of comparing module (a coarse comparing module or a fine comparing module), and the reference signal may be clearly illustrated according to the description of FIG. 6A to FIG. 6D.

Additionally, the aforementioned control signals CTRL1 and CTL1 may be the same signal.

Figure 7A:
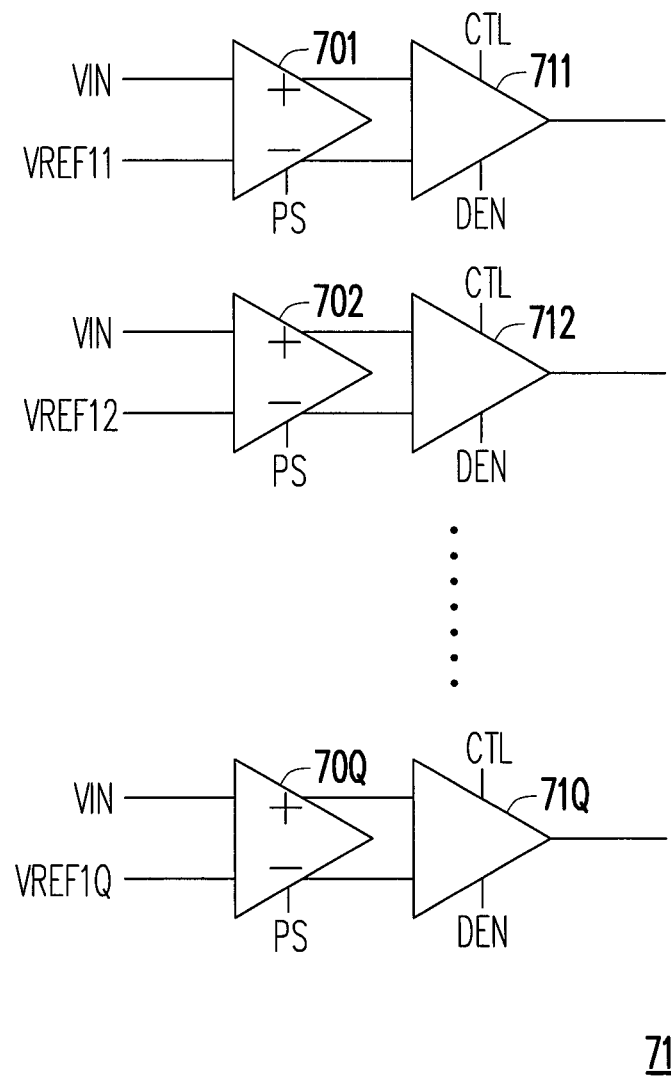
FIG. 7A and FIG. 7B respectively show different implementing modes of a fine comparing module according to an embodiment of the disclosure.
Figure 7B:
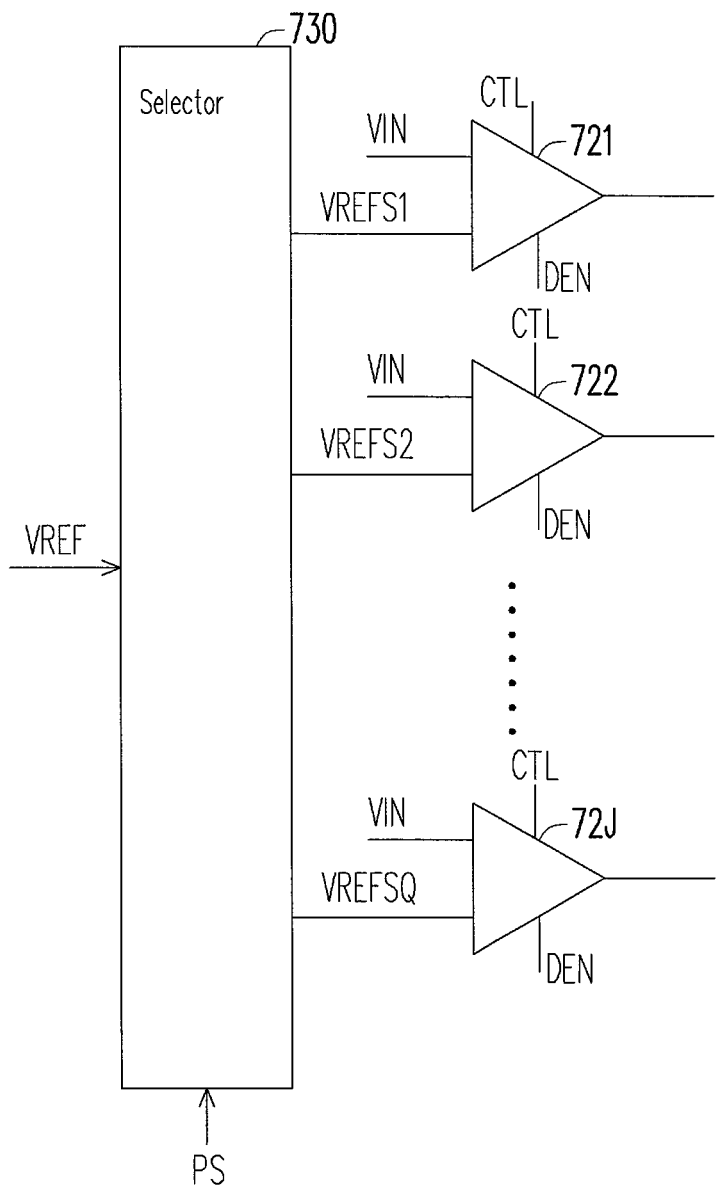

Referring to FIG. 7A and FIG. 7B, FIG. 7A and FIG. 7B respectively show different implementing modes of a fine comparing module according to an embodiment of the disclosure. In FIG. 7A, the fine comparing module 710 includes pre-amplifiers 701-70Q and comparators 711-71Q. The pre-amplifiers 701-70Q commonly receive an input signal VIN.

The pre-amplifiers 701-70Q respectively receive reference signals VREF11-VREF1Q. It should be noted that, in this embodiment, the reference signals VREF11-VREF1Q received by the pre-amplifiers 701-70Q are fixed. Additionally, the pre-amplifiers 701-70Q receive a previous selecting signal PS provided by a previous level of pre-switching detection module. Moreover, a part of the pre-amplifiers 701-70Q determines whether to enter an enabled state according to the received previous selecting signal PS. The remaining part of the pre-amplifiers remains in a disabled state.

The comparators 711-71Q respectively receive control signal CTL and a previous encoding result DEN which is generated by the encoder according to a coarse comparing result DC (or a fine comparing result DF) provided by a previous level of coarse comparing module (or fine comparing module). A plurality of comparators are selected from the comparators 711-71Q according to the previous encoding result DEN in combination with the control signal CTL to perform the comparing action. It should be noted that, inputs of the comparators 711-71Q are respectively coupled to the outputs of the pre-amplifiers 701-70Q, but are not connected to the input signal VIN and reference signals VREF11-VREF1Q.

For example, when primary pre-amplifiers set by the previous selecting signal PS are pre-amplifiers 701 and 702, the pre-amplifiers 701 and 702 are set to be the primary enabled pre-amplifiers. The pre-amplifiers 701 and 702 implement the function of pre-amplifying according to a respective voltage difference between the input signal VIN and the reference signals VREF11 and VREF12. After the previous encoding result DEN is generated (according to the coarse comparing result DC or the fine comparing result DF), if the pre-amplifier 701 selected by the previous encoding result is a selected enabled pre-amplifier, the comparator 711 is also set to be a selected comparator. At this time, the comparator 711 actually performs the comparing action according to a pre-amplifying output result of the selected enabled pre-amplifier 701.

In FIG. 7B, the fine comparing module 720 includes comparators 721-72J and a selector 730. The selector 730 receives reference signals VREF and a previous selecting signal PS. The selector 730 selects a plurality of reference signals from the reference signals VREF as primary reference signals VREFS1-VREFSJ according to the previous selecting signal PS. The comparators 721-72J are coupled to the selector 730 to receive the primary reference signals VREFS1-VREFSJ. Additionally, the comparators 721-72J further receive a control signal CTL and a previous encoding result DEN which is generated by the encoder according to a coarse comparing result DC (or a fine comparing result DF) provided by a previous level of coarse comparing module (or fine comparing module). A plurality of comparators are selected from the comparators 721-72J according to the previous encoding result DEN in combination with the control signal CTL to perform the comparing action. It is taken as an example that the reference signal VREFS1 is a selected reference signals. The comparators 721-72J set the comparator 721 as a selected comparator according to the previous encoding result DEN. That is to say, the comparator 721 performs the comparing action on the selected reference signal VREFS1 and the input signal VIN according to the previous encoding result DEN.

Figure 8:
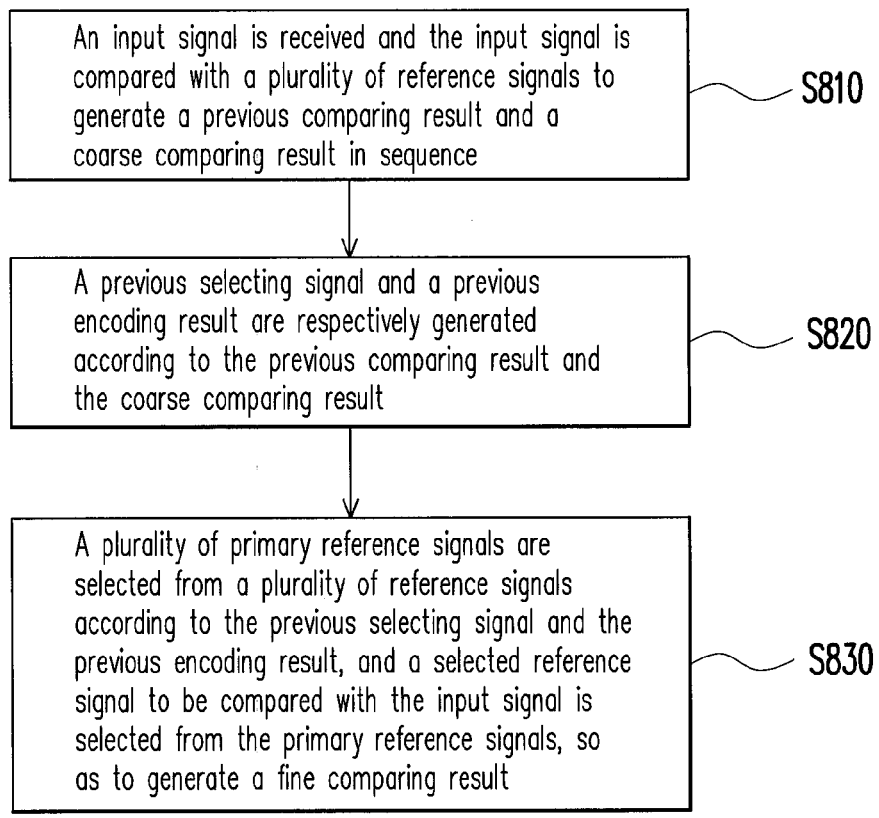
FIG. 8 shows a flow chart of an ADC method according to an embodiment of the disclosure.

Subsequently, referring to FIG. 8, FIG. 8 shows a flow chart of an ADC method according to an embodiment of the disclosure. The ADC steps in this embodiment of the disclosure include the following. First, an input signal is received and the input signal is compared with a plurality of reference signals to generate a previous comparing result and a coarse comparing result in sequence (S810). Moreover, a previous selecting signal and a previous encoding result are respectively generated according to the previous comparing result and the coarse comparing result (S820). Furthermore, a plurality of primary reference signals are selected from a plurality of reference signals according to the previous selecting signal and the previous encoding result, and a selected reference signal selected from the primary reference signals is compared with the input signal, so as to generate a fine comparing result (S830). Likewise, this process is also applicable to the operating process of two adjacent levels of fine comparing modules. Details of each step are described in the above embodiments and implementing modes, which are not described again herein.

To sum up, in the disclosure, when the coarse comparing module performs the comparing, a previous selecting signal is generated correspondingly through a previous comparing result that is generated earlier, and primary reference signals or pre-amplifiers that may be used in a fine comparing module is preset through the previous selecting signal. Moreover, when a previous encoding result is generated, a group of selected reference signals or enabled pre-amplifiers to be compared with an input signal are selected from the primary reference signals or enabled pre-amplifiers. In this way, the ADC apparatus does not need to wait when the primary reference signals are set, so that that the fine comparing module is rapidly enabled to perform the comparing action after the coarse comparing module finishes the comparing action. Therefore, the ADC efficiency is effectively improved. Likewise, the concept is also applicable to the operating process of two adjacent levels of fine comparing modules.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An analog-to-digital converting (ADC) apparatus, comprising:
   a coarse comparing module, used to receive an input signal and compare the input signal and a plurality of first reference signals to generate a previous comparing result and a coarse comparing result in sequence;
   at least one pre-switching detection module, used to receive the previous comparing result and generate a previous selecting signal according to the previous comparing result;
   an encoder, coupled to the coarse comparing module, and used to generate a previous encoding result according to the coarse comparing result; and
   at least one fine comparing module, coupled to the pre-switching detection module and the encoder, and used to receive the input signal, the previous selecting signal, and the previous encoding result, the fine comparing module selects a plurality of primary reference signals from a plurality of second reference signals according to the previous selecting signal, and selects a selected reference signal from the primary reference signals according to the previous encoding result to be compared with the input signal for generating a fine comparing result.

2. The ADC apparatus according to claim 1, wherein the fine comparing module comprises:
   a plurality of comparators, wherein the comparators respectively receive the second reference signals, the comparators commonly receive the input signal, the fine comparing module selects a plurality of primary comparators from the comparators according to the previous selecting signal, and selects at least one selected comparator from the primary comparators according to the previous encoding result.

3. The ADC apparatus according to claim 2, wherein reference signals received by the primary comparators correspondingly are the primary reference signals respectively, and a reference signal received by the selected comparator correspondingly is the selected reference signal.

4. The ADC apparatus according to claim 1, wherein the fine comparing module comprises:
a plurality of comparators, wherein the fine comparing module provides the primary reference signals to the comparators according to the previous selecting signal, and the fine comparing module selects at least one selected comparator from the comparators according to the previous encoding result for performing a comparing action.

5. The ADC apparatus according to claim 4, wherein a reference signal received by the selected comparator correspondingly is the selected reference signal.

6. The ADC apparatus according to claim 1, wherein the coarse comparing module comprises:
N comparators, wherein the coarse comparing module respectively compares the input signal and the first reference signals for generating the comparing result with N bits; the comparing results are used to provide the previous comparing result with N bits or the coarse comparing result with N bits, and N is an integer larger than 1.

7. The ADC apparatus according to claim 6, wherein the pre-switching detection circuit comprises:
a pre-charging switch circuit, used to receive a reference power supply and controlled by a control signal, wherein the pre-charging switch circuit is conducted and transmits the reference power supply to a first output terminal and a second output terminal according to the control signal;
a first buffer, used to receive an inverse signal of one of the comparing results;
a second buffer, disposed to receive another signal of the comparing results; and
a voltage transmitting switch circuit, coupled to the first and the second output terminals and the first and the second buffers, wherein the voltage transmitting switch circuit is controlled by an output voltage of the first buffer to transmit an output voltage of the second buffer to the first output terminal, and the voltage transmitting switch circuit is controlled by the output voltage of the second buffer to transmit the output voltage of the first buffer to the second output terminal.

8. The ADC apparatus according to claim 7, wherein the pre-charging switch circuit comprises:
a first transistor, having a first terminal, a second terminal, and a control terminal, wherein the first terminal of the first transistor receives the reference power supply; the control terminal of the first transistor receives the control signal; and the second terminal of the first transistor is coupled to the first output terminal; and
a second transistor, having a first terminal, a second terminal, and a control terminal, wherein the first terminal of the second transistor receives the reference power supply; the control terminal of the second transistor receives the control signal; and the second terminal of the second transistor is coupled to the second output terminal.

9. The ADC apparatus according to claim 8, wherein the first and the second transistors are P-type transistors.

10. The ADC apparatus according to claim 8, wherein the voltage transmitting switch circuit comprises:
a third transistor, having a first terminal, a second terminal, and a control terminal, wherein the second terminal of the third transistor is coupled to the first output terminal, the control terminal of the third transistor is coupled to an output terminal of the first buffer, and the first terminal of the third transistor is coupled to an output terminal of the second buffer; and
a fourth transistor, having a first terminal, a second terminal, and a control terminal, wherein the second terminal of the fourth transistor is coupled to the second output terminal; the control terminal of the fourth transistor is coupled to an output terminal of the second buffer; and the first terminal of the fourth transistor is coupled to an output terminal of the first buffer.

11. The ADC apparatus according to claim 10, wherein the third and the fourth transistors are N-type transistors.

12. The ADC apparatus according to claim 7, wherein the first and the second buffers are respectively a first and a second inverters.

13. The ADC apparatus according to claim 7, wherein the pre-switching detection circuit further comprises:
a third buffer, wherein an input terminal of the third buffer is coupled to the first output terminal and generates a bit of the previous selecting signal; and
a fourth buffer, wherein an input terminal of the fourth buffer is coupled to the second output terminal and generates another bit of the previous selecting signal.

14. The ADC apparatus according to claim 13, wherein the third and the fourth buffers are respectively a third and a fourth inverters.

15. The ADC apparatus according to claim 1, wherein the encoder further generates an ADC result according to the coarse comparing result and the fine comparing result.

16. An analog-to-digital converting (ADC) method, comprising:
receiving an input signal and comparing the input signal and a plurality of first reference signals to generate a previous comparing result and a coarse comparing result in sequence;
respectively generating a previous selecting signal and a previous encoding result according to the previous comparing result and the coarse comparing result; and
selecting a plurality of primary reference signals from a plurality of second reference signals according to the previous selecting signal, and selecting a selected reference signal to be compared with the input signal from the primary reference signals according to the previous encoding result for generating a fine comparing result.

17. The ADC method according to claim 16, the step of comparing the input signal and the first reference signals to generate the previous comparing result and the coarse comparing result in sequence comprises:
respectively comparing the input signal and the first reference signals to generate the previous comparing result with N bits and the coarse comparing result with N bits in sequence, wherein N is an integer larger than 1.

18. The ADC method according to claim 16, wherein the step of selecting the primary reference signals from the second reference signals according to the previous selecting signal and selecting the selected reference signal to be compared with the input signal from the primary reference signals according to the previous encoding result to generate the fine comparing result comprises:

selecting a plurality of primary comparators from a plurality of comparators according to the previous selecting signal; and selecting at least one selected comparator from the primary comparators according to the previous encoding result to perform a comparing action, wherein the comparators respectively receive the second reference signals, and the comparators commonly receive the input signal.

19. The ADC method according to claim 16, wherein the step of selecting the primary reference signals from the second reference signals according to the previous selecting signal and selecting the selected reference signal to be compared with the input signal from the primary reference signals according to the previous encoding result so as to generate the fine comparing result comprises:

providing the primary reference signals to a plurality of comparators according to the previous selecting signal; and selecting at least one selected comparator from the comparators according to the previous encoding result to perform a comparing action.

20. The ADC method according to claim 15, further comprising:

performing encoding on the coarse comparing result and the fine comparing result to generate an ADC result.

* * * * *